US012444571B2

(12) United States Patent
Downey

(10) Patent No.: US 12,444,571 B2
(45) Date of Patent: Oct. 14, 2025

(54) PLASMA SOURCE WITH A COOLANT LEAKAGE DETECTION SYSTEM

(71) Applicant: Applied Materials, Inc., Santa Clara, CA (US)

(72) Inventor: Ryan T. Downey, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 100 days.

(21) Appl. No.: 18/412,328

(22) Filed: Jan. 12, 2024

(65) Prior Publication Data

US 2025/0232953 A1 Jul. 17, 2025

Related U.S. Application Data

(60) Provisional application No. 63/545,714, filed on Oct. 25, 2023.

(51) Int. Cl.
*H01J 37/32* (2006.01)

(52) U.S. Cl.
CPC ..... *H01J 37/3211* (2013.01); *H01J 37/32853* (2013.01); *H01J 37/32183* (2013.01); *H01J 2237/002* (2013.01)

(58) Field of Classification Search
CPC ............. H01J 37/3211; H01J 37/32853; H01J 37/32183; H01J 2237/002
See application file for complete search history.

(56) References Cited

U.S. PATENT DOCUMENTS

2012/0080148 A1 4/2012 Zhang
2018/0337027 A1* 11/2018 L'Heureux ............ B01D 53/32
2020/0255938 A1* 8/2020 Chong .................. C23C 14/564
2020/0321202 A1* 10/2020 Johanson, Jr. .... H01J 37/32477
2022/0065727 A1* 3/2022 Faradzhev ......... H05K 7/20281
2022/0165549 A1 5/2022 Sonti (Continued)

FOREIGN PATENT DOCUMENTS

CN 211472721 U * 9/2020
CN 119069331 A * 12/2024 .............. H01J 37/20

(Continued)

OTHER PUBLICATIONS

International Search Report and Written Opinion for Application No. PCT/US2024-051660 dated Feb. 6, 2025.

*Primary Examiner* — Adam D Houston

(74) *Attorney, Agent, or Firm* — Patterson + Sheridan, LLP

(57) ABSTRACT

Disclosed herein are a plasma source, an abatement unit, and a method for detecting a coolant leak. The plasma source includes an RF generation system coupled with a cooling system. The RF generation system includes one or more electrical components comprising a hollow RF antenna for generating a plasma. The cooling system includes a coolant channel extending through the plasma source, including the electrical components of the RF generation system; a first flow control device coupled to the coolant channel to control a flow of the coolant into the coolant channel and electrically isolated from the hollow antenna; a second flow control device coupled to the coolant channel to control a flow of the coolant out of the coolant channel; and a pressure measurement device coupled with the coolant channel to measure a pressure level of the coolant. The coolant channel includes the hollow RF antenna.

20 Claims, 6 Drawing Sheets

(56) References Cited

U.S. PATENT DOCUMENTS

| | | | | |
|---|---|---|---|---|
| 2024/0087852 | A1* | 3/2024 | Lewis | H01J 37/32357 |
| 2025/0087457 | A1* | 3/2025 | Hill | H01J 37/3244 |
| 2025/0140533 | A1* | 5/2025 | Cho | H01L 21/67109 |

FOREIGN PATENT DOCUMENTS

| | | | | | |
|---|---|---|---|---|---|
| JP | 2000306898 | A | | 11/2000 | |
| JP | 2020042979 | A | * | 3/2020 | |
| KR | 101026236 | B1 | * | 3/2011 | G21C 17/022 |
| WO | WO-2025087776 | A1 | * | 5/2025 | H01J 37/28 |

* cited by examiner

PLASMA SOURCE WITH A COOLANT LEAKAGE DETECTION SYSTEM

RELATED APPLICATIONS

This application claims benefit from U.S. Provisional Application Ser. No. 63/545,714, filed Oct. 25, 2023, the contents of which is incorporated by reference in its entirety.

BACKGROUND

Field

The present disclosure relates to a plasma source of a semiconductor processing system, and, more specifically, relates to a plasma source comprising a coolant leakage detection system capable of detecting the leakage of a cooling medium.

Description of the Related Art

In semiconductor processing, plasma is used in many processes, including deposition of layers, etch of materials, cleaning of chambers, and abatement of effluent gases. Plasma sources have been integrated into multiple components of a semiconductor processing system. These plasma sources typically require cooling to remove heat generated during operation. These plasma sources may use a cooling system which circulates a coolant, such as water, throughout the plasma source to remove heat.

A cooling system may develop a coolant leak due to wear and tear, sputter erosion, electric arcing, and etc. The leaked coolant can be drawn into a plasma region, which is often in a vacuum. Even an introduction of a small amount of coolant into the plasma region may generate adverse effects in the processes. Current methods to detect a leak in a plasma system have relied on observations of any liquid on a floor or any adverse effects on the vacuum region. The current methods may not timely detect a leak. In addition, small leaks, such as pin holes in a cooling systems, may be difficult to be detected by the current methods.

Thus, a need exists for a plasma source with an improved system for detecting a coolant leak.

SUMMARY

Disclosed herein are a plasma source including a cooling system capable of detecting a coolant leak, an abatement unit comprising the plasma source, and a method for detecting a coolant leak. In an example, the plasma source includes an RF generation system coupled with a cooling system. The RF generation system includes one or more electrical components operable to generate a plasma in a plasma region, the one or more electrical components comprising a hollow RF antenna. The cooling system includes a coolant channel extending through the plasma source, including the one or more electrical components of the RF generation system, and configured to flow a coolant; a first flow control device coupled to the coolant channel to control a flow of the coolant into the coolant channel and electrically isolated from the hollow RF antenna; a second flow control device coupled to the coolant channel to control a flow of the coolant out of the coolant channel; and a pressure measurement device coupled with the coolant channel to measure a pressure level of the coolant. The coolant channel includes the hollow RF antenna.

In another example, an abatement unit for abating effluent gases of a processing chamber includes a plasma source for abating the effluent gases with plasma; and a controller coupled with the plasma source and configured to control components of the plasma source. The plasma source is configured according to embodiments of the present disclosure.

In another example, the method of detecting a coolant leak of a plasma source. The plasma source includes an RF generation system coupled with a coolant leakage system. The method includes transmitting RF electrical signals along the RF generation system of the plasma source, the RF generation system comprising a hollow RF antenna; circulating a coolant within a coolant channel extending through the RF generation system, the coolant channel comprising the hollow RF antenna; measuring, by a pressure measurement device, a pressure level of the coolant; controlling, by flow control devices coupled with the coolant channel, a flow of the coolant inside the coolant channel according to the RF electrical signals; and determining, by a controller, whether a leak occurs inside the coolant channel based on the pressure level.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Disclosed herein are a cooling system capable of detecting a coolant leak and a plasma source including the cooling system. The cooling system includes a hollow RF antenna which can transmit RF power signals to a plasma chamber and circulate a coolant within an internal coolant channel. The coolant channel contacts external surfaces of a plasma chamber. The coolant within the coolant channel removes heat from the plasma chamber.

The cooling system includes two valves controlling the coolant flow into and out of the coolant channel. The cooling system further includes a pressure measurement device disposed between the valves and the plasma chamber. When the plasma chamber stops generating plasma, the two valves are shut off, thus isolating the coolant within the coolant channel, including the hollow RF antenna, from external influences. The pressure measurement device measures the pressure level of the isolated coolant and transmits the measured pressure level to a controller. The controller determines whether a coolant leak occurs based on the measured pressure level. As the coolant channel, including the hollow RF antenna, contains a limited amount of coolant, even a small leak, such as a leak through a pin hole, can cause a noticeable drop of the pressure level, which is detected by the pressure measurement device. Thus, the present cooling system can detect a small, early stage coolant leak and allow the plasma source and a higher level system to take timely remediation actions.

A controller of the plasma source or a higher level system may compare the measured pressure level with a predetermined threshold to determine a leak. Other methods may also be implemented to determine a leak, such as by observing a trend of the pressure levels over a period, comparing the pressure level with a history of the pressure level, or any other suitable methods. After a leak is determined, the controller may turn off the coolant system, transmit a message to an operator, or take any other mitigation and/or notification tasks.

Figure 1:
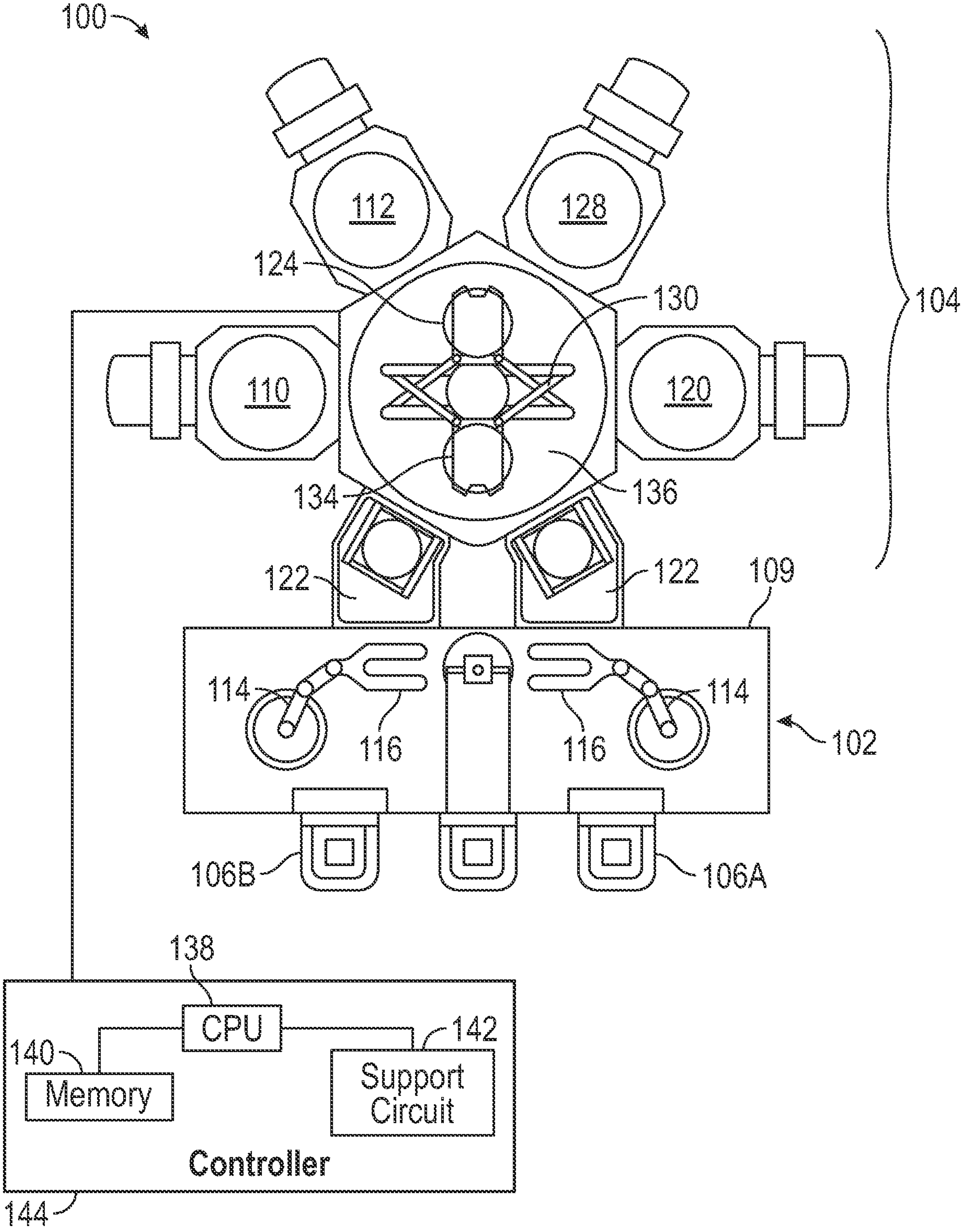
FIG. 1 illustrates a schematic top view of a processing system, according to an embodiment of the present disclosure.

FIG. 1 illustrates a schematic top view of a processing system 100, according to one or more embodiments. According to an embodiment, the processing system 100 includes a cooling system as described in the present disclosure for a plurality of plasma sources. The cooling system includes a coolant leakage detection subsystem configured to detect a coolant leak. The processing system 100 includes one or more load lock chambers 122 (two are shown in FIG. 1), a processing platform 104, a factory interface 102, and a controller 144. In one or more embodiments, the processing system 100 may be adapted for use in a CENTURA® integrated processing system provided by Applied Materials, Inc., located in Santa Clara, California. It is contemplated that other processing systems (including those from other manufacturers) may be adapted to benefit from the present disclosure.

The processing platform 104 includes a plurality of processing chambers 110, 112, 120, 128, the one or more load lock chambers 122, and a transfer chamber 136 that is coupled to the one or more load lock chamber 122. The transfer chamber 136 can be maintained under vacuum, or can be maintained at an ambient (e.g., atmospheric) pressure. Two load lock chambers 122 are shown in FIG. 1. The factory interface 102 is coupled to the transfer chamber 136 through the load lock chambers 122.

In one or more embodiments, the factory interface 102 includes at least one docking station 109 and at least one factory interface robot 114 to facilitate the transfer of substrates 124. The docking station 109 is configured to accept one or more front opening unified pods (FOUPs). Two FOUPS 106A, 106B are shown in the implementation of FIG. 1. The factory interface robot 114 having a blade 116 disposed on one end of the robot 114 is configured to transfer one or more substrates from the FOUPS 106A, 106B, through the load lock chambers 122, to the processing platform 104 for processing. Substrates being transferred can be stored at least temporarily in the load lock chambers 122.

Each of the load lock chambers 122 has a first port interfacing with the factory interface 102 and a second port interfacing with the transfer chamber 136. The transfer chamber 136 has a vacuum robot 130 disposed therein. The vacuum robot 130 has one or more blades 134 (two are shown in FIG. 1) capable of transferring the substrates 124 between the load lock chambers 122 and the processing chambers 110, 112, 120, and 128.

The controller 144 is coupled to the processing system 100 and is used to control processes and methods, such as the operations of the methods described herein (for example the operations of the methods as described in other parts of the present disclosure). The controller 144 includes a central processing unit (CPU) 138, a memory 140 containing instructions, and support circuits 142 for the CPU. The controller 144 controls various items directly, or via other computers and/or controllers.

Figure 2:
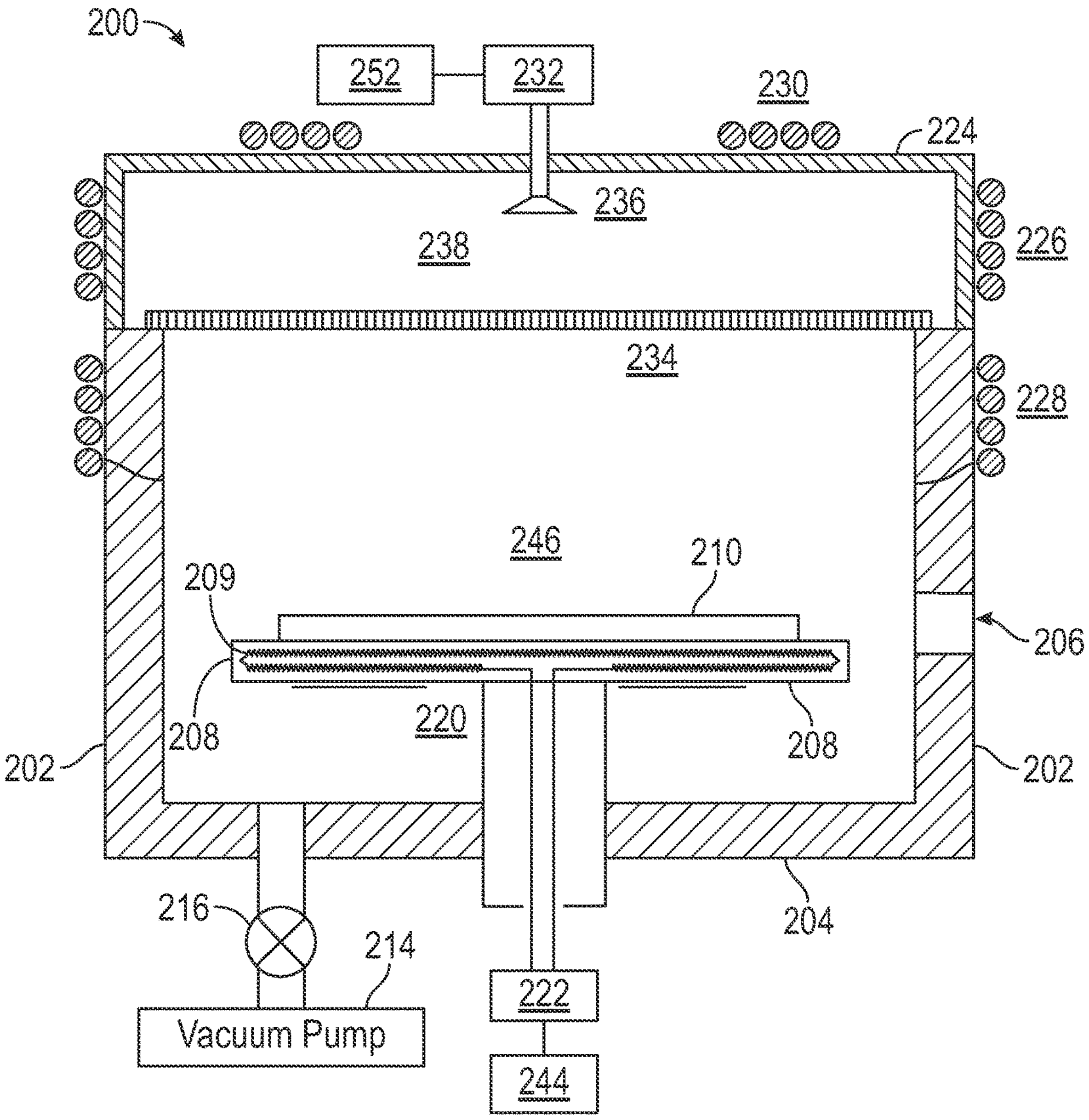
FIG. 2 illustrates a schematic cross-sectional view of a processing chamber having a plurality of plasma sources, according to an embodiment of the present disclosure.

FIG. 2 illustrates a processing chamber 200 having a plurality of plasma sources according to an embodiment. The processing chamber 200 may be any one of the processing chambers 110, 112, 128, and 120 as shown in FIG. 1. The processing chamber 200 in FIG. 2 includes side walls 202, a bottom 204, a chamber lid 224, and a lower wall liner 248. The chamber lid 224, the side walls 202, and the bottom 204 together enclose a processing region 246. A susceptor 220 is disposed in the processing region 246 and supports a substrate 210 thereon during processing. The side walls 202 include a plurality of ports 206 for transferring the substrate 210 in or out of the processing chamber 200.

The processing chamber 200 further includes a vacuum pump 214 and a plurality of gas sources 232. A remote plasma source 252 may be coupled with the gas feed of one or more of the gas sources 232 and configured to energize each process gas independently or energize a mixture of two or more of the process gases. The energized process gas is provided to the chamber 200 via a top baffle 236. The vacuum pump 214 is coupled to the processing chamber 200 and configured to adjust the vacuum level within the process region 246 via a valve 216. Vacuum pump 214 is also configured to evacuate spent gases from the processing chamber 200.

The processing chamber 200 also includes a gas plenum 238 contained between the lid 224 and a showerhead 234. The gas sources 232 provide process gases into the gas plenum 238 via a top baffle 236. The gas showerhead 234 includes a plurality of conduits that allow the process gases to flow through.

The processing chamber 200 includes a plurality of plasma sources 226, 228, 230 disposed at various locations of the processing chamber 200 to energize the process gases. As shown in FIG. 2, a plasma source 230 may be disposed at a top surface of the lid 224, and/or another plasma source 226 is disposed around the side walls of the lid 224. The plasma sources 230 and 226 are operable to energize the process gases above the showerhead 234, i.e. within the gas plenum 238. Another plasma source 228 may disposed along side walls 202 and is operable to energize the process gases between the showerhead 234 and the susceptor 220. The plasma sources 252, 230, 226, and 228 can be controlled independently or collectively by the controller 144 depicted in FIG. 1. According to an embodiment, any one, any two, any three or all of the plasma sources 252, 230, 226, and 228 may include a cooling system as described in the present disclosure.

Figure 3:
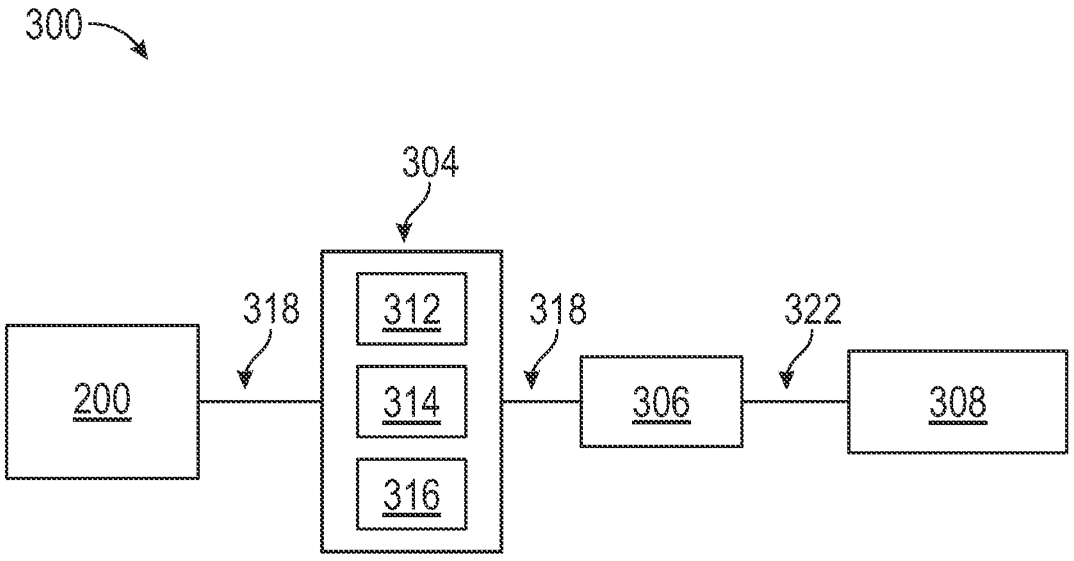
FIG. 3 illustrates a schematic diagram of an abatement system having a plasma source, according to an embodiment.

FIG. 3 illustrates an abatement system 300 with a plasma source according to an embodiment. The semiconductor processing system 100 includes an abatement system 300 coupled with the processing chamber 200. The abatement system 300 includes a pre-pump abatement unit 304, a pump 306, and a primary abatement system 308. The foreline 318 couples the processing chamber 200 with the pre-pump abatement unit 304. Another foreline 318 couples the pre-pump unit 304 with a pump 306. A transferring line 322 couples the pump 306 with the primary abatement system 308. The pump 306 is configured to move the effluent gases from the pre-pump abatement unit 304 to the primary abatement system 308.

The pre-pump abatement system 304 may include a plasma abatement unit, such as an Aeris® abatement unit available from Applied Materials, Inc., located in Santa Clara, California, among other suitable systems. The pre-pump abatement system 304 includes a plasma source 314, a reagent delivery unit 312, and a controller 316. The plasma source 314 may be a remote plasma source, an in-line plasma source, or other suitable plasma source for generating a plasma within a treatment region of the pre-pump abatement system 304. According to an embodiment, the plasma source 314 includes a coolant detection leakage system as described in the present disclosure. The reagent delivery unit 312 delivers one or more reagents into the foreline 318 or treatment region according to instructions by the controller 316. The controller 316 is configured to control operations of the pre-pump abatement unit 304. The controller 316 may be similarly configured as the controller 144.

Figure 4:
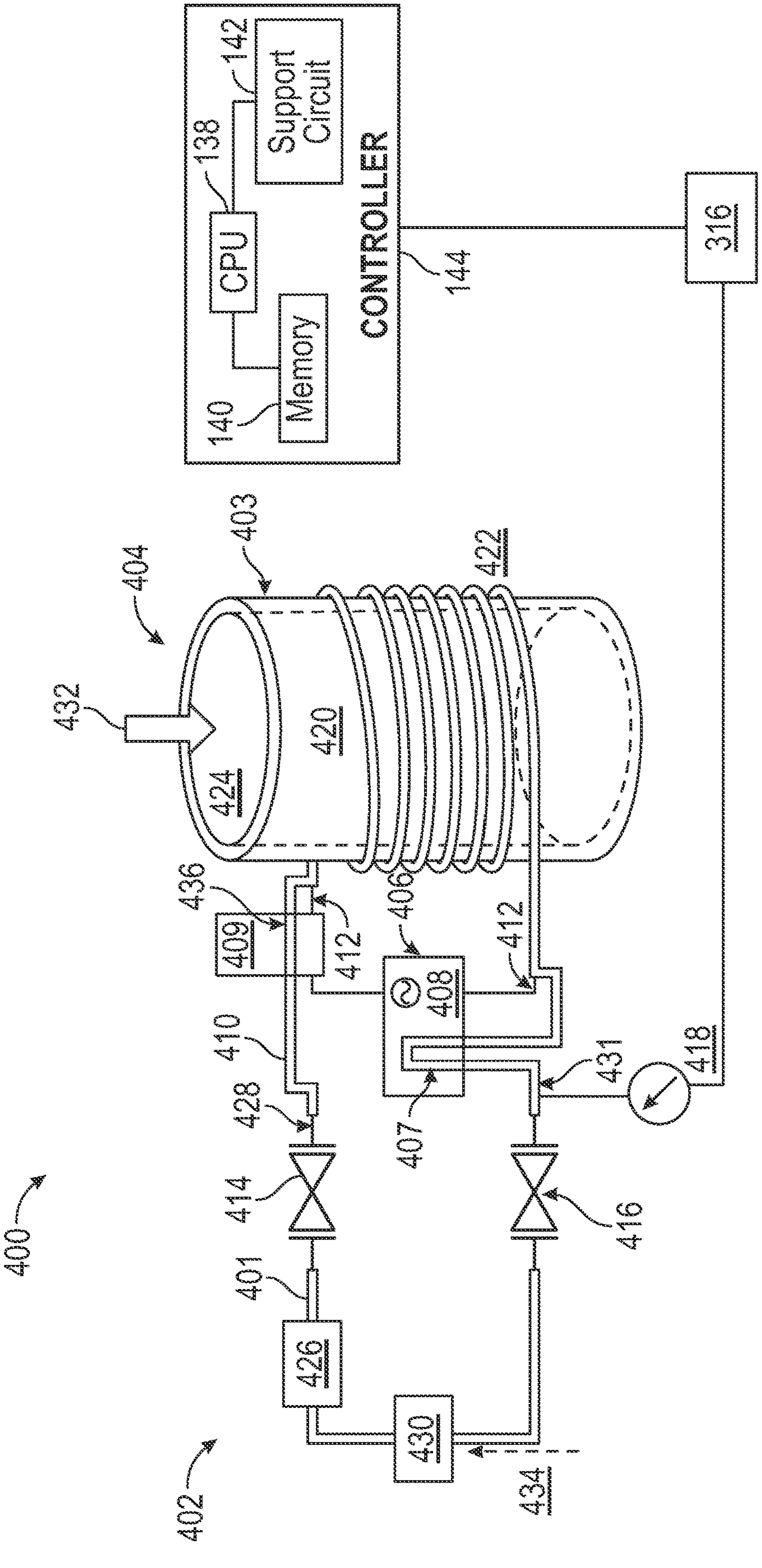
FIG. 4 illustrates a schematic diagram of a plasma source having a system for detecting a coolant leak, according to an embodiment.

FIG. 4 illustrates a schematic view of a plasma source 400, according to an embodiment of the present disclosure. The plasma source 400 includes a cooling system 402 coupled with an RF generation system 406. The RF generation system 406 is configured to generate a plasma. The cooling system 402 circulates a coolant 401 along various electrical components of the RF generation system to remove heat generated during operation. The coolant 401 may be any material that is capable of transferring heat, such as water or any other suitable materials. In an embodiment, the cooling system and the RF generation system 406 share a hollow RF antenna 422, which transmits both RF electric signals of the RF generation system 406 and flows a coolant 401 of the cooling system 402. The coolant leakage system 402 is also configured to detect a coolant leakage in the cooling system, including the hollow RF antenna.

The RF generation system 406 includes an RF power source 408, an impedance matching network 409, a dielectric body 404, and an RF antenna 422 which are connected by a plurality of electrical connections 412. The RF power source 408 is configured to generate RF electric signals. The impedance matching network 409 is configured to match the impedance between the RF power source 408 and the RF antenna 422. The dielectric body 404 includes the dielectric wall 424 and the plasma region 420. According to an embodiment, the dielectric body 404 may be of any shape, such as a tubular shape or any other suitable shapes. The dielectric wall 424 is made of a dielectric material, such as ceramic, quartz or any other suitable materials.

The RF antenna 422 is conductive and is capable of transmitting the RF power signals with little loss. According to an embodiment, the RF antenna 422 is disposed around an external surface 403 of the dielectric body 404, such as the dielectric wall 424, and forms loops around the dielectric wall 424. The RF antenna 422 may be made of a conductive material, such as copper or another other suitable materials.

Figure 5:
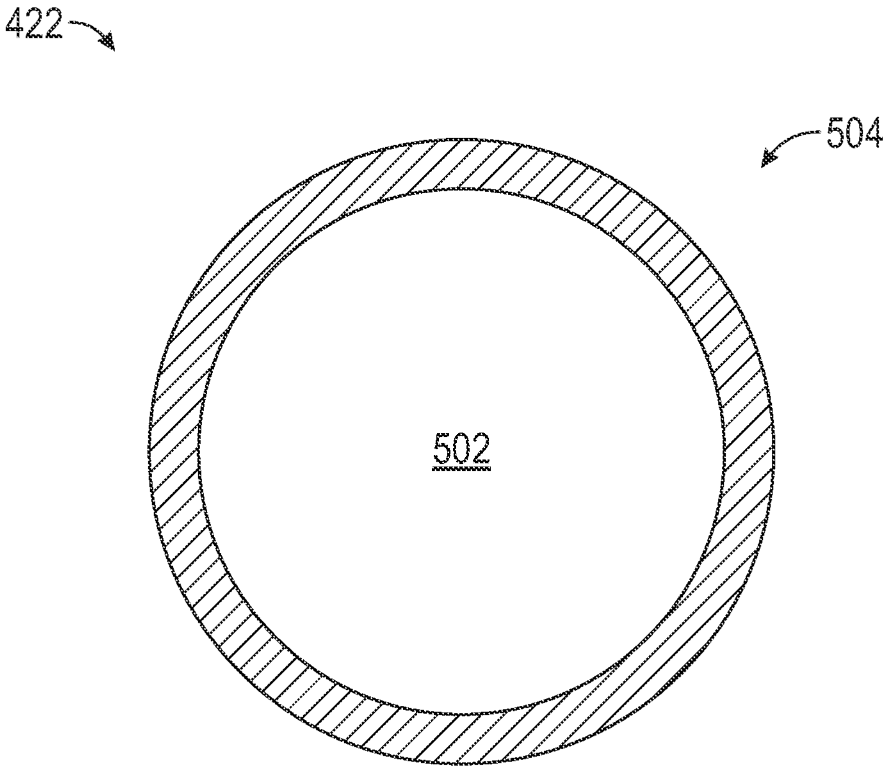
FIG. 5 illustrates a schematic cross-sectional view of an RF antenna, according to an embodiment.

According to an embodiment, the RF antenna 422 is hollow. As shown in FIG. 5, the RF antenna 422 may include an internal coolant channel 502 enclosed by a wall 504. The wall 504 is made of a conductive material, such as copper, aluminum, or any other suitable materials. The wall 504 is configured to transmit the RF power signals. The coolant channel 502 allows the coolant to be circulated within the RF antenna 422.

Electrical connections 412 are also conductive and capable of transmitting the RF power signals with little loss. Electrical connections 412 are made of a conductive material, such as copper, aluminum, or any other suitable materials. But, the electrical connections 412 do not function as liquid channels and do not have an internal channel to flow the coolant 401.

During a plasma generation, the RF power source 408 generates RF electrical signals and transmits the RF electrical signals to the RF antenna 422 via the electric connections 412 and the impedance matching network 409. When process gases 432 flow into the plasma region 420, the process gases 432 are energized by the RF electrical signals transmitted by the RF antenna 422. According to an embodiment, the RF antennas 422 generates an inductively coupled plasma inside the plasma region 420.

As shown in FIG. 4, the cooling system 402 includes a coolant source 430, a pump 426, a first flow control device 414, a coolant inlet 428, a pressure measurement device 418, a coolant outlet 431, and a second flow control device 416. The cooling system 402 may also include controllers 316 and 144, which control the operations of the cooling system 402. In an embodiment, a coolant channel 410 is formed between the coolant inlet 428 and the coolant outlet 431 and extends through the RF generation system 402.

The coolant channel 410 is configured to flow the coolant 401 through electrical components of the RF generation system 406 to remove heat. An arrow 434 indicates a flow direction of the coolant 401. The coolant channel 410 includes a plurality of channel segments extending through various electrical components of the RF generation system, such as a channel segment 407 in the RF power source 408, a channel segment 436 in the impedance matching network 409, and the RF antenna 422 functioning as its own channel segment. In an embodiment, the plurality of channel segments are serially connected such that the coolant 401 sequentially flows from one electric component to another one of the RF generation system 402. In another embodiment, the channel segments may be connected in parallel.

The first and second flow control devices are configured to control the flow of the coolant 401 into and out of the coolant channel 410. According to an embodiment, the coolant inlet 428 is electrically isolated from the RF generation system 406. The coolant outlet 431 is also electrically isolated from the RF generation system 406. In an embodiment, the channel segments 407 and 436 function as electrical insulators. For example, the channel segments 407 and 436 are made of non-conductive materials, such as rubber, plastic, or any other suitable materials. Although the channel segments 407 and 436 are connected with the RF antenna 422 and the electrical connections 412, electrical signals of the RF generation system 406 may not transmit to the flow control devices because the channel segments 407 and 436 are electrical insulators.

According to an embodiment, the pressure measurement device 418 of the cooling system 402 is configured to detect a pressure of the coolant 401 inside the coolant channel 410. The pressure measurement device 418 may be any device that is capable of measuring a pressure of the coolant 401, such as a pressure gauge or any other suitable devices.

The pressure measurement device 418 may be disposed at any suitable locations along the coolant channel 410. For example, the pressure measurement device 418 may be disposed between the second flow control device 416 and the coolant outlet 431. The pressure measurement device 418 may also be disposed between the first flow control device 414 and the coolant inlet 428. According to an embodiment, the pressure measurement device 418 may be coupled with the controller 316 of the pre-pump abatement unit 304, which is coupled with the controller 144 of the processing system 100. According to another embodiment, the pressure measurement device 418 may be directly coupled with the controller 144 or other system-level controllers. Any one of the controllers 316 and 144 may be configured to determine whether leakage occurs in the coolant channel 410 based on the measured pressure value.

The pressure measurement device 418 is configured to measure pressure levels of the coolant inside the coolant channel 410 during a plasma generation process and/or after a plasma generation process. The pressure measurement device 418 also transmits the measured pressure levels to the controllers 316 and/or 144. The controllers 316 and 144 are configured to receive operational parameters of the pump 426 and the plasma region 420, which are used to determine whether a pressure fluctuation is related to a coolant leak or not. A leak determining method may include examining an immediate change of the pressure level, comparing the measured pressure level with a predetermined threshold or a recorded history of the pressure levels, and any other information.

After a plasma generation process is completed, the first and second flow control devices 414 and 416 are shut off to isolate the coolant 401 inside the coolant channel 410. After the flow control devices are shut off, any pressure fluctuation measured by the pressure measurement device 418 is likely cause by a coolant leak. In an example, when the pressure measurement device 418 detects a pressure drop instantly after the shutoff of the flow control devices, the controllers 316 and 144 can determine that a leak may occur inside the coolant channel 410.

Figure 6:
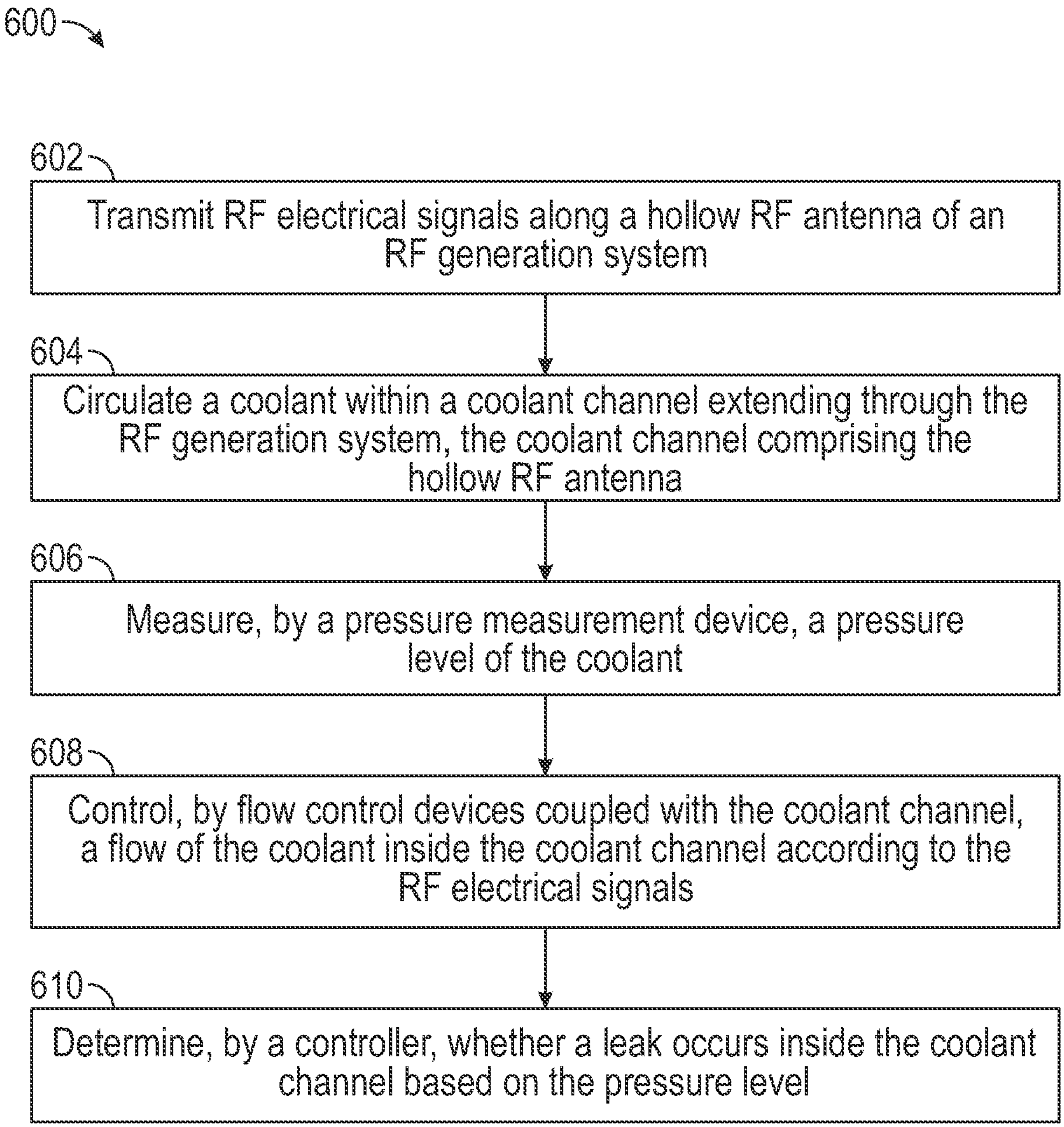
FIG. 6 illustrates operations of a method for detecting a coolant leak of a plasma source.

FIG. 6 illustrates a method 600 of detecting a coolant leak in a plasma source. The plasma source includes an RF generation system coupled with a cooling system. The RF generation system includes a hollow RF antenna. The cooling system includes a coolant channel. The method 600 includes a plurality of operations. At operation 602, RF electric signals are transmitted along the hollow RF antenna of the RF generation system. The RF electric signals are transmitted to a dielectric body that encloses a plasma region. When process gases flow into the plasma region, the RF electrical signals can generate plasma. At operation 604, a coolant is circulated within the coolant channel extending through the RF generation system to remove heat from the plasma source. The coolant channel includes the hollow RF antenna. At operation 606, a pressure measurement device measures a pressure level of the coolant. At operation 608, flow control devices of the coolant leakage system control a flow of the coolant inside the coolant channel, including the hollow RF antenna, according to the RF electrical signals. The flow control devices may shut off the flow of the coolant when the RF electrical signals are turned off and reopen the flow of the coolant when the RF electrical signals are turned on. The pressure measurement device continues measuring the pressure level while the follow control devices are shut off. At operation 610, a controller determines whether a leak occurs inside the coolant channel based on the pressure level. For example, a leak in the RF antenna may be determined when the pressure level drops instantly after the RF electrical signal is turned off. The controller may determine whether a leak occurs in the coolant channel after each completion of a plasma generation process. The controller may also transmit a notification about the leak to a higher level controller so that an inspection of the leak and/or actions to mitigate potential damages may be initiated.

It is contemplated that one or more aspects disclosed herein may be combined. Moreover, it is contemplated that one or more aspects disclosed herein may include some or all of the aforementioned benefits. While the foregoing is directed to embodiments of the present disclosure, other and further embodiments of the disclosure may be devised without departing from the basic scope thereof, and the scope thereof is determined by the claims that follow.

What is claimed is:

1. A plasma source for generating plasma comprising:

an RF generation system comprising one or more electrical components operable to generate a plasma in a plasma region; and a cooling system comprising:

a coolant channel extending through the plasma source and configured to flow a coolant to cool the one or more electrical components;

a first flow control device coupled to the coolant channel to control a flow of the coolant into the coolant channel;

a second flow control device coupled to the coolant channel to control a flow of the coolant out of the coolant channel; and a pressure measurement device coupled with the coolant channel to measure a pressure level of the coolant.

2. The plasma source of claim 1, wherein the one or more electrical components comprise a hollow RF antenna configured to transmit an electric signal, and the hollow RF antenna comprises an internal channel that forms a first channel segment of the coolant channel.

3. The plasma source of claim 2, wherein the cooling system comprises a pump coupled with a coolant source coupled with the coolant channel via the first flow control device and/or the second flow control device.

4. The plasma source of claim 2, wherein the one or more electrical components comprise an RF power source, and the coolant channel includes a second channel segment extending through the RF power source, and wherein the first flow control device is electrically isolated from the RF power source and the hollow RF antenna.

5. The plasma source of claim 2, wherein the RF generation system comprises a dielectric body enclosing the plasma region, and the hollow RF antenna wraps around the dielectric body.

6. The plasma source of claim 2, wherein the one or more electrical components comprises an impedance matching network, and the coolant channel includes a third channel segment extending through the impedance matching network.

7. The plasma source of claim 1, wherein the cooling system comprises a controller coupled with the pressure measurement device and configured to determine whether a coolant leak occurs based on the pressure level.

8. The plasma source of claim 7, wherein the first and second flow control devices are configured to isolate the coolant in the coolant channel after a plasma process, and the pressure measurement device is configured to measure the pressure level of the coolant isolated in the coolant channel.

9. An abatement unit for abating effluent gases of a processing chamber, the abatement unit comprising:

a plasma source for abating the effluent gases with plasma and comprising an RF generation system and a cooling system; and a controller configured to control operations of the plasma source, wherein the RF generation system comprises one or more electrical components operable to generate a plasma in a plasma region, and wherein the cooling system comprises:

a coolant channel extending through the plasma source and configured to flow a coolant to cool the one or more electrical components;

a first flow control device coupled to the coolant channel to control a flow of the coolant into the coolant channel;

a second flow control device coupled to the coolant channel to control a flow of the coolant out of the coolant channel; and a pressure measurement device coupled with the coolant channel to measure a pressure level of the coolant.

10. The abatement unit of claim 9, wherein the one or more electrical components comprise a hollow RF antenna configured to transmit an electric signal, and the hollow RF antenna comprises an internal channel that forms a first channel segment of the coolant channel.

11. The abatement unit of claim 10, wherein the cooling system comprises a pump coupled with a coolant source coupled with the coolant channel via the first flow control device and/or the second flow control device.

12. The abatement unit of claim 10, wherein the one or more electrical components comprises an RF power source, and the coolant channel includes a second channel segment extending through the RF power source, and wherein the first flow control device is electrically isolated from the RF power source and the hollow RF antenna.

13. The abatement unit of claim 10, wherein the RF generation system comprises a dielectric body enclosing the plasma region, and the hollow RF antenna wraps around the dielectric body.

14. The abatement unit of claim 10, wherein the one or more electrical components comprises an impedance matching network, and the coolant channel includes a third channel segment extending through the impedance matching network.

15. The abatement unit of claim 9, wherein the cooling system is configured to determine whether a coolant leak occurs based on the pressure level.

16. The abatement unit of claim 15, wherein the first and second flow control devices are configured to isolate the coolant in the coolant channel after a plasma process, and the pressure measurement device is configured to measure the pressure level of the coolant isolated in the coolant channel.

17. A method of detecting a coolant leak of a plasma source comprising:

transmitting RF electrical signals along an RF generation system of the plasma source, the RF generation system comprising one or more electrical components;

circulating a coolant within a coolant channel extending through the plasma source to cool the one or more electrical components;

measuring, by a pressure measurement device, a pressure level of the coolant;

controlling, by flow control devices coupled with the coolant channel, a flow of the coolant inside the coolant channel according to the RF electrical signals; and determining, by a controller, whether a leak occurs inside the coolant channel based on the pressure level.

18. The method of claim 17, wherein the one or more electrical components comprise a hollow RF antenna, and the method further comprises:

flowing the coolant inside an internal channel of the hollow RF antenna.

19. The method of claim 18, further comprising:

shutting off the flow control devices when the RF electrical signals are turned off; and measuring the pressure level while the flow control devices are shut off.

20. The method of claim 18, further comprising:

determining whether a leak occurs inside the coolant channel after each completion of a plasma process.

* * * * *